United States Patent
Tanaka et al.

(10) Patent No.: US 11,965,060 B2
(45) Date of Patent: *Apr. 23, 2024

(54) FLUORINE-CONTAINING EPOXY RESIN FOR ELECTRICAL MATERIALS AND METHOD FOR MANUFACTURING SAME

(71) Applicant: DAIKIN INDUSTRIES, LTD., Osaka (JP)

(72) Inventors: Yoshito Tanaka, Osaka (JP); Tomohiro Yoshida, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/533,359

(22) Filed: Nov. 23, 2021

(65) Prior Publication Data
US 2022/0081507 A1    Mar. 17, 2022

Related U.S. Application Data

(63) Continuation of application No. PCT/JP2020/020963, filed on May 27, 2020.

(30) Foreign Application Priority Data

Jun. 12, 2019 (JP) ................. 2019-109435

(51) Int. Cl.
| | |
|---|---|
| C08G 59/30 | (2006.01) |
| B32B 27/38 | (2006.01) |
| C08G 59/24 | (2006.01) |
| C08G 59/50 | (2006.01) |
| C08L 63/00 | (2006.01) |
| C09D 163/00 | (2006.01) |
| H05K 1/03 | (2006.01) |
| C09J 163/00 | (2006.01) |

(52) U.S. Cl.
CPC ......... *C08G 59/308* (2013.01); *C08G 59/245* (2013.01); *C08G 59/5073* (2013.01); *H05K 1/034* (2013.01)

(58) Field of Classification Search
None
See application file for complete search history.

(56) References Cited

U.S. PATENT DOCUMENTS

| | | | | |
|---|---|---|---|---|
| 4,981,941 A | * | 1/1991 | Griffith | ................ C08G 59/423 |
| | | | | 528/92 |
| 5,157,148 A | | 10/1992 | Ohmori et al. | |
| 5,202,360 A | | 4/1993 | Ohmori et al. | |

(Continued)

FOREIGN PATENT DOCUMENTS

| | | |
|---|---|---|
| CN | 106280254 A | 1/2017 |
| JP | 64-085949 A | 3/1989 |

(Continued)

OTHER PUBLICATIONS

International Preliminary Report on Patentability dated Dec. 14, 2021 with a Translation of the Written Opinion of the International Searching Authority in Application No. PCT/JP2020/020963.

(Continued)

*Primary Examiner* — Michael J Feely
(74) *Attorney, Agent, or Firm* — Sughrue Mion, PLLC

(57) ABSTRACT

A fluorine-containing epoxy resin for an electronic component represented by the following formula (E) wherein n is an integer of 0 or greater, an average value of n is 0.18 or smaller, and M is a group represented by the following formula (E1), a group represented by the following formula (E2), or a group represented by the following formula (E3) wherein Z is hydrogen or a C2-C10 fluoroalkyl group. The formula (E) being:

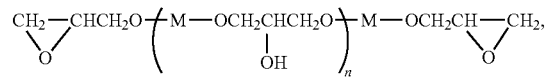

the formula (E1) being:

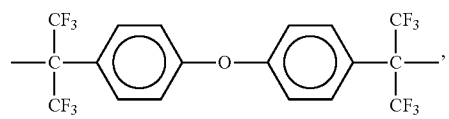

the formula (E2) being:

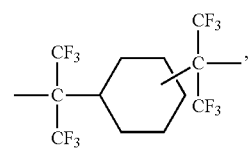

the formula (E3) being:

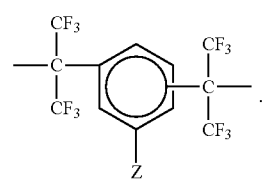

(Continued)

Also disclosed is a method for producing the fluorine-containing epoxy resin as well as a curable composition containing the fluorine-containing epoxy resin and a curing agent.

6 Claims, No Drawings

(56) References Cited

U.S. PATENT DOCUMENTS

| | | |
|---|---|---|
| 5,578,740 A | 11/1996 | Au et al. |
| 5,908,943 A * | 6/1999 | Au .................. C07D 303/24 549/559 |
| 2022/0298294 A1* | 9/2022 | Tanaka ................ C08G 59/686 |

FOREIGN PATENT DOCUMENTS

| | | |
|---|---|---|
| JP | 2-245324 A | 10/1990 |
| JP | 2003-177260 A | 6/2003 |
| JP | 2009-167354 A | 7/2009 |
| JP | 2009-167357 A | 7/2009 |
| KR | 10-0395988 B1 | 11/2003 |

OTHER PUBLICATIONS

Maruno T., et al., "Synthesis and Properties of a Novel Fluorine-Containing Alicyclic Diepoxide", Macromolecules, 1996, pp. 2006-2010, vol. 29, No. 6, ISSN:0024-9297.

International Search Report for PCT/JP2020/020963 dated Aug. 18, 2020.

Extended European Search Report dated Dec. 22, 2022 in counterpart European Application No. 20821998.0.

* cited by examiner

FLUORINE-CONTAINING EPOXY RESIN FOR ELECTRICAL MATERIALS AND METHOD FOR MANUFACTURING SAME

CROSS REFERENCE TO RELATED APPLICATIONS

This application is a continuation application of International Application No. PCT/JP2020/020963 filed May 27, 2020, claiming priority based on Japanese Patent Application No. 2019-109435 filed Jun. 12, 2019, the respective disclosures of which are incorporated herein by reference in their entirety.

TECHNICAL FIELD

The disclosure relates to fluorine-containing epoxy resins for an electronic component and methods for producing the same.

BACKGROUND ART

Resins such as phenolic resins, epoxy resins, and polyimide resins have been used for stacking materials for a multi-layer printed wiring board. In the trend where computers execute operations at higher speed, there has been a strong demand for a higher signal propagation speed of multi-layer printed wiring boards. Satellite communication systems and mobile radio systems utilize high frequencies in the gigahertz (GHz) band. Thus, materials of printed wiring boards for transmission and reception devices of such systems are to have excellent high-frequency-transmission properties. Under such circumstances, materials having a lower permittivity and a lower dissipation factor than conventional materials such as epoxy resins and polyimide resins have been awaited.

For example, Patent Literature 1 discloses a laminate of prepregs each obtained by impregnating a sheet substrate with an impregnation varnish that contains a fluorine-containing epoxy compound having a specific structure, and drying the substrate.

CITATION LIST

Patent Literature

Patent Literature 1: JP H02-245324 A

SUMMARY

The disclosure relates to a fluorine-containing epoxy resin for an electronic component, represented by the following formula (E):

[Chem. 1]

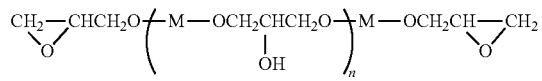

wherein n is an integer of 0 or greater; an average value of n is 0.18 or smaller; and M is a group represented by the following formula (E1):

[Chem. 2]

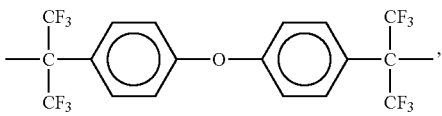

a group represented by the following formula (E2):

[Chem. 3]

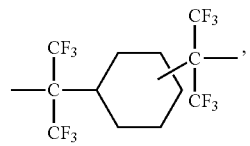

or a group represented by the following formula (E3):

[Chem. 4]

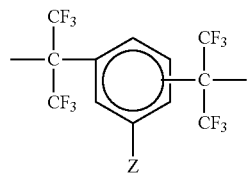

wherein Z is hydrogen or a C2-C10 fluoroalkyl group.

Advantageous Effects

The fluorine-containing epoxy resin for an electronic component of the disclosure has a low permittivity and a low dissipation factor as well as a small coefficient of linear expansion. The production method of the disclosure can provide a specific fluorine-containing epoxy resin by a novel method.

DESCRIPTION OF EMBODIMENTS

The fluorine-containing epoxy resin for an electronic component of the disclosure is represented by the formula (E).

In the formula (E), n is an integer of 0 or greater, and the average value of n is 0.18 or smaller. With an average value of n of 0.18 or smaller, the fluorine-containing epoxy resin has a low coefficient of linear expansion while having a low permittivity and a low dissipation factor, and is thus particularly suitably applied to an electronic component. The fluorine-containing epoxy resin for an electronic component of the disclosure is particularly suitably applied to an electronic component also in terms of excellent heat resistance, low water absorption, low moisture absorption, and excellent mechanical properties. The disclosure also relates to use of the fluorine-containing epoxy resin for an electronic component of the disclosure for an electronic component.

The fluorine-containing epoxy resin for an electronic component of the disclosure may optionally contain components such as a compound represented by the formula (F), a compound represented by the formula (G), and solvent(s) as described later, and thus may be a composition containing a compound represented by the formula (E).

The average value of n is preferably 0.18 or smaller, more preferably 0.16 or smaller. In terms of the mechanical properties and adhesiveness of a cured product of the fluorine-containing epoxy resin, the average value of n is preferably 0 or greater, more preferably 0.01 or greater, still more preferably 0.08 or greater, further more preferably 0.09 or greater, particularly preferably 0.1 or greater. The average value of n may be 0.

The n is the value determined from the area ratio in gel permeation chromatography (GPC).

For example, when the area ratio of a compound having a value n of 0 is 0.93, the area ratio of a compound having a value n of 1 is 0.06, and the area ratio of a compound having a value n of 2 is 0.01 relative to the entire area of the compounds in the fluorine-containing epoxy resin represented by the formula (E), the average value of n is 0.08 (=1*0.06+2*0.01).

GPC may be performed under any conditions, such as a condition using Shodex KF-801 and KF-802 each having a length of 30 cm as columns and chloroform as a developing solvent.

The M is preferably a group represented by the formula (E1) or a group represented by the formula (E2), more preferably a group represented by the formula (E2).

Preferably, the M is a group represented by the formula (E2), and the ratio by mole of a 1,3-isomer of the group represented by the formula (E2) to a 1,4-isomer thereof (1,3-isomer/1,4-isomer) is 0/100 to 100/0. The ratio by mole (1,3-isomer/1,4-isomer) is more preferably 95/5 to 50/50, still more preferably 95/5 to 70/30, particularly preferably 95/5 to 80/20.

The 1,3-isomer of the group represented by the formula (E2) and the 1,4-isomer thereof have the following structures.

1,3-Isomer of the group represented by the formula (E2)

[Chem. 5]

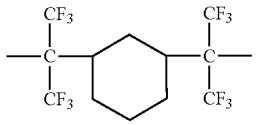

1,4-Isomer of the group represented by the formula (E2)

[Chem. 6]

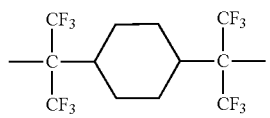

The fluorine-containing epoxy resin for an electronic component of the disclosure preferably has an epoxy equivalent of 250 or more, more preferably 260 or more, still more preferably 265 or more. The epoxy equivalent is preferably 310 or less, more preferably 300 or less.

The epoxy equivalent is the value determined by the method in conformity with JIS K-7236.

The fluorine-containing epoxy resin for an electronic component of the disclosure preferably has a glass transition temperature of 100° C. to 200° C. The glass transition temperature is more preferably 110° C. or higher, still more preferably 120° C. or higher, further more preferably 130° C. or higher. The glass transition temperature may be 150° C. or lower.

The glass transition temperature is the temperature at the middle point of an endothermic curve of second run, the endothermic curve being obtained by performing temperature rising (first run)—temperature dropping—temperature rising (second run) at a temperature-changing rate of 10° C./min in a temperature range from 30° C. to 250° C. using a differential scanning calorimeter (DSC, available from SEIKO, RTG220).

The fluorine-containing epoxy resin for an electronic component of the disclosure preferably has a coefficient of linear expansion of 150 ppm or less. The coefficient of linear expansion is more preferably 100 ppm or less, still more preferably 70 ppm or less, further more preferably 60 ppm or less, still further more preferably 55 ppm or less, particularly preferably 50 ppm or less. The lower limit of the coefficient of linear expansion may be, but is not limited to, 10 ppm or more, for example.

The coefficient of linear expansion is the value determined by thermomechanical analysis (TMA).

The fluorine-containing epoxy resin for an electronic component of the disclosure preferably has a relative permittivity of 3.8 or lower, more preferably 3.4 or lower, still more preferably 3.0 or lower, particularly preferably 2.6 or lower. The lower limit of the relative permittivity may be, but is not limited to, 2.2 or higher or 2.4 or higher, for example.

The relative permittivity is the value determined by the automatic balance bridge method (parallel-plate capacitor method) at 11 GHz in conformity with JIS C 2138.

The fluorine-containing epoxy resin for an electronic component of the disclosure preferably has a dissipation factor of 0.05 or lower, more preferably 0.03 or lower, still more preferably 0.02 or lower, particularly preferably 0.01 or lower. The lower limit of the dissipation factor may be, but is not limited to, 0.001 or higher or 0.002 or higher, for example.

The dissipation factor is the value determined by the auto-balancing bridge method (parallel-plate capacitor method) at 11 GHz in conformity with JIS C 2138.

The fluorine-containing epoxy resin for an electronic component of the disclosure preferably has a refractive index of 1.40 to 1.50, more preferably 1.45 or lower, still more preferably 1.43 or lower, particularly preferably 1.42 or lower, while it may be 1.41 or higher or 1.42 or higher.

The refractive index is the value measured with an Abbe's refractometer.

The glass transition temperature, coefficient of linear expansion, relative permittivity, dissipation factor, and refractive index are the values of a specimen obtained by adding 2 parts by mass of 2-ethyl-4-methyl imidazole to 100 parts by mass of the fluorine-containing epoxy resin for an electronic component of the disclosure, heating the components to 50° C., uniformly mixing it to provide a curable composition, and curing the composition at 200° C. for five hours.

The fluorine-containing epoxy resin for an electronic component of the disclosure may further contain a compound represented by the following formula (F):

[Chem. 7]

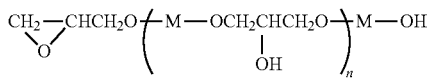

wherein M and n are defined as described above, in an amount of preferably 0 to 10% by mass, more preferably 0 to 5% by mass, still more preferably 0 to 3% by mass, particularly preferably 0 to 2% by mass. The amount of the compound represented by the formula (F) may be 0.0001% by mass or more, 0.001% by mass or more, 0.01% by mass or more, or 0.1% by mass or more.

In the production process of the fluorine-containing epoxy resin for an electronic component of the disclosure, a compound represented by the formula (F) having an epoxy group at one end and a hydroxy group at the other end may be generated. In such a case, the fluorine-containing epoxy resin for an electronic component of the disclosure may contain the compound represented by the formula (F) in an amount within the above range.

In the case of containing the compound represented by the formula (F), the fluorine-containing epoxy resin for an electronic component of the disclosure may be referred to as a composition containing the fluorine-containing epoxy resin for an electronic component represented by the formula (E) and the compound represented by the formula (F).

The fluorine-containing epoxy resin for an electronic component of the disclosure may further contain a fluorine-containing diol represented by the following formula (G):

HO-M-OH wherein M is defined as described above, in an amount of preferably 0 to 10% by mass, more preferably 0 to 5% by mass, still more preferably 0 to 3% by mass, particularly preferably 0 to 2% by mass. The amount of the fluorine-containing diol may be 0.01% by mass or more or 0.1% by mass or more.

The fluorine-containing epoxy resin for an electronic component of the disclosure can be produced from a compound represented by the formula (G) as a raw material. In such a case, the compound represented by the formula (G) as a raw material may remain in the fluorine-containing epoxy resin for an electronic component. The fluorine-containing epoxy resin for an electronic component of the disclosure may contain the compound represented by the formula (G) within the above range.

In the case of containing the compound represented by the formula (G), the fluorine-containing epoxy resin for an electronic component of the disclosure may be referred to as a composition containing the fluorine-containing epoxy resin for an electronic component represented by the formula (E) and the compound represented by the formula (G).

The fluorine-containing epoxy resin for an electronic component of the disclosure has an average value of n in the formula (E) of 0.18 or smaller. Accordingly, the fluorine-containing epoxy resin has a small coefficient of linear expansion and excellent mechanical properties while having a low permittivity and a low dissipation factor, and is thus suitable as a material for an electronic component (electronic material application), particularly as a material having a low permittivity. The disclosure relates to use of the fluorine-containing epoxy resin as a low dielectric material.

The fluorine-containing epoxy resin for an electronic component of the disclosure may be applied to any electronic component and is useful for high-frequency printed boards that are to have high frequency properties. Examples of high-frequency printed boards include substrates of electronic devices such as an antenna, a radar system, a router in networking, a backplane, and a wireless infrastructure; substrates for automotive sensors; and substrates for engine management sensors. The fluorine-containing epoxy resin is particularly suitable for applications for reducing the transmission loss in the millimeter-wave band. The disclosure also relates to use of the fluorine-containing epoxy resin for a high-frequency printed board.

Also, the fluorine-containing epoxy resin for an electronic component of the disclosure can be used for a paste, a B-stage film, and an electronic material for resin-coated copper foil or a prepreg for a printed board, particularly for a high-frequency multilayer substrate and a buildup insulating material.

The fluorine-containing epoxy resin for an electronic component of the disclosure can be obtained by reacting, for example, a fluorine-containing diol represented by the following formula (G):

HO-M-OH wherein M is defined as described above, with epichlorohydrin.

The average value of n in the formula (E) can be adjusted to 0.18 or smaller by, for example, controlling the reaction temperature or the amount of epichlorohydrin used in the reaction. For example, the average value of n can be adjusted to 0.18 or smaller by using an excessive amount of epichlorohydrin.

Alternatively, the average value of n can be adjusted after the reaction. Examples of the method include a method of sorting initial fractions by distilling the obtained fluorine-containing epoxy resin under reduced pressure, a method of controlling the average value of n to 0.18 or smaller using the poor solvent and the good solvent disclosed in JP 2006-233078 A, and a method of dissolving the obtained fluorine-containing epoxy resin in a solvent, cooling the solution, and crystallizing the resin to efficiently adjust the average value of n to be 0.18 or smaller.

The fluorine-containing epoxy resin for an electronic component of the disclosure can also be obtained by a method for producing a fluorine-containing epoxy resin, including reacting a fluorine-containing diol represented by the following formula (G):

HO-M-OH wherein M is defined as described above, with a compound containing a double bond to provide a fluorine-containing olefin containing two double bonds, and oxidizing the fluorine-containing olefin to provide a fluorine-containing epoxy resin.

This production method can provide a fluorine-containing epoxy resin having a value of n in the formula (E) of 0.

The compound containing a double bond may be any compound that contains a double bond in the molecule structure and reacts with the hydroxy groups of the fluorine-containing diol to provide the fluorine-containing olefin, and a preferred example thereof is a compound represented by $CH_2=CH-R$, wherein R is an organic group or a silyl group.

Examples of the R include a C1-C10 alkyl group in which one or some of the hydrogen atoms bonded to a carbon atom is/are replaced by halogen atom(s), a C1-C10 hydroxyalkyl group, a C1-C10 silylalkyl group, and a silyl group.

Specific examples of the compound containing a double bond include halogenated allyls such as allyl chloride and allyl bromide and compounds such as allyl alcohol and allyl silane.

The step of providing a fluorine-containing olefin may be any step that includes reacting the hydroxy groups of a fluorine-containing diol with a compound containing a double bond to provide a fluorine-containing olefin, and the step may be performed at 20° C. to 80° C., preferably at 30° C. to 60° C.

In the step of oxidizing the fluorine-containing olefin to provide a fluorine-containing epoxy resin, the oxidization can be performed by reacting the fluorine-containing olefin with an oxidant. Specifically, the oxidization can be performed by adding an oxidant to a reaction container filled with the fluorine-containing olefin.

The oxidant may be any oxidant that can oxidize and thereby convert the double bond of the fluorine-containing olefin into an epoxy group, and examples thereof include hydrogen peroxide and acetyl hydroperoxide.

The amount of the oxidant used is preferably 2 to 5 mol, more preferably 2.1 to 3 mol relative to 1 mol of the fluorine-containing olefin.

The fluorine-containing olefin is preferably oxidized at 30° C. or higher, more preferably 40° C. or higher, while preferably 80° C. or lower, more preferably 70° C. or lower.

The disclosure also provides a curable composition containing the fluorine-containing epoxy resin for an electronic component or a fluorine-containing epoxy resin obtained by the production method. The curable composition of the disclosure is particularly suitable for an electronic component.

The curing agent is preferably a curing agent for an epoxy resin. Examples of the curing agent for an epoxy resin include 4,4'-diaminodicyclohexylmethane, 1,4-diaminocyclohexane, 2,6-diaminopyridine, m-phenylenediamine, p-phenylenediamine, 4,4'-diaminodiphenylmethane, 2,2'-bis(4-aminophenyl)propane, benzine, 4,4'-diaminophenyl oxide, 4.4'-diaminophenyl sulfone, bis(4-aminophenyl)methyl phosphine oxide, bis(4-aminophenyl)phenyl phosphine oxide, bis(4-aminophenyl)methyl amine, 1,5-diaminonaphthalene, m-xylylenediamine, 1,1'-bis(p-aminophenyl)phthalan, p-xylylenediamine, hexamethylenediamine, 6,6'-diamino-2,2'-dipyridyl, 4,4'-diaminobenzophenone, 4,4'-diaminoazobenzene, bis(4-aminophenyl)phenyl methane, 1,1-bis(4-aminophenyl)cyclohexane, 1,1-bis(4-amino-3-methyl phenyl)cyclohexane, 2,5-bis(m-aminophenyl)-1,3,4-oxadiazole, 2,5-bis(p-aminophenyl)-1,3,4-oxadiazole, 2,5-bis(p-aminophenyl)-1,3,4-oxadiazole, 5,5-di(m-aminophenyl)-(2,2')bis(1,3,4-oxadiazolyl), 4,4'-diaminodiphenyl ether, 4,4'-bis(p-aminophenyl)-2,2'-dithiazole, m-bis(4-p-aminophenyl-2-thiazolyl)benzene, 4,4'-diaminobenzanilide, 4,4'-diaminophenylbenzoate, N,N'-bis(4-aminobenzyl)-p-phenylenediamine, 4,4'-methylene bis(2-dichloroaniline), benzoguanamine, methylguanamine, tetramethylbutanediamine, phthalic anhydride, trimellitic anhydride, pyromellitic anhydride, benzophenonetetracarboxylic anhydride, ethylene glycol bis(anhydrotrimellitate), glycerol tris(anhydrotrimellitate), maleic anhydride, 2-methylimidazole, 2-phenylimidazole, 2-ethyl-4-methylimidazole, 2-undecylimidazole, and a boron trifluoride complex. These may be used alone or in combination of two or more thereof.

The amount of the curing agent for an epoxy resin is preferably 0.1 to 50 parts by mass relative to 100 parts by mass of the fluorine-containing epoxy resin, or relative to 100 parts by mass of the total of the fluorine-containing epoxy resin and the fluorine-free epoxy resin when the curable composition contains a fluorine-free epoxy resin.

Examples of the curing agent for an epoxy resin include, although some of the following have already been exemplified, polyamines, polycarboxylic acids, acid anhydrides, and phenols, as well as imidazoles, polymercaptans, and organic acid hydrazides.

Examples of polyamines include diethylenetriamine, dipropylenetriamine, triethylenetetramine, tetraethylenepentamine, dimethylaminopropylamine, diethylaminopropylamine, dibutylaminopropylamine, hexamethylenediamine, N-aminoethylpiperazine, trimethylhexamethylenediamine, bis-(hexamethylene)triamine, polyoxypropylenediamine, 3,3'-dimethyl-4,4'-diaminodicyclohexylmethane, 3-amino-1-cyclohexylaminopropane, 4,4'-diaminodicyclohexylmethane, isophoronediamine, 1,3-bis(aminomethyl)cyclohexane, a mixture of N-dimethylcyclohexylaminopropane and 4,4'-diaminodicyclohexylaminopropane, 4,4'-diaminodiphenylmethane, 4,4'-diaminodiphenyl ether, diaminodiphenylsulfone, m-phenylenediamine, 2,4-toluylenediamine, 2,6-toluylenediamine, 2,3-toluylenediamine, 3,4-toluylenediamine, methaxylylenediamine, xylylenediamine, dicyandiamide, and diacetone acrylamide.

Examples of polycarboxylic acids include phthalic acid, hydroxyisophthalic acid, succinic acid, sebacic acid, maleic acid, dodecenylsuccinic acid, chlorendic acid, pyromellitic acid, trimellitic acid, hexahydrophthalic acid, methylhexahydrophthalic acid, tetrahydrophthalic acid, methyltetrahydrophthalic acid, and methylnadic acid.

Examples of acid anhydrides include maleic anhydride, dodecenylsuccinic anhydride, chlorendic anhydride, sebacic anhydride, phthalic anhydride, pyromellitic anhydride, trimellitic anhydride, cyclopentane-tetracarboxylic dihydride, hexahydrophthalic anhydride, methylhexahydrophthalic anhydride, tetramethylenemaleic anhydride, tetrahydrophthalic anhydride, methyltetrahydrophthalic anhydride, endomethylenetetrahydrophthalic anhydride, methylendomethylenetetrahydrophthalic anhydride, 5-(2,5-dioxotetrahydroxyfuryl)-3-methyl-3-cyclohexene-1,2-dicarboxylic anhydride, and methylnadic anhydride.

Examples of phenols include various polyhydric phenols including bisphenol A, bisphenol F, bisphenol S, bisphenol AD, hydroquinone, resorcinol, methyl resorcinol, biphenol, tetramethyl biphenol, dihydroxy naphthalene, dihydroxy diphenyl ether, thiodiphenols, phenol novolac resin, cresol novolac resin, phenol aralkyl resin, biphenyl aralkyl resin, naphthol aralkyl resin, terpene phenolic resin, dicyclopentadiene phenolic resin, bisphenol A novolac resin, trisphenol methane resin, naphthol novolac resin, brominated bisphenol A, and brominated phenol novolac resin; polyhydric phenolic resins obtainable by a condensation reaction of a phenol and an aldehyde such as benzaldehyde, hydroxy benzaldehyde, crotonaldehyde, or glyoxal; polyhydric phenolic resins obtainable by a condensation reaction of a xylene resin and a phenol; cocondensated resins of heavy oil or a pitch, a phenol, and a formaldehyde; and various phenolic resins such as a phenol/benzaldehyde/xylylene dimethoxide polycondensate, a phenol/benzaldehyde/xylylene dihalide polycondensate, a phenol/benzaldehyde/4,4'-dimethoxidebiphenyl polycondensate, and a phenol/benzaldehyde/4,4'-dihalide biphenyl polycondensate.

The curing agents for an epoxy resin may be used alone or in combination of two or more thereof.

In an embodiment, the curable composition of the disclosure preferably contains the curing agent for an epoxy resin in an amount of 0.01 to 10 equivalents, more preferably 0.1 to 5 equivalents, still more preferably 0.5 to 2 equivalents in terms of the equivalent ratio relative to the total of the fluorine-containing epoxy resin and the fluorine-free epoxy resin. Such an embodiment is preferred in terms of curability.

The curable composition of the disclosure may contain a cationic polymerization initiator or an anionic polymerization initiator in place of or in addition to the curing agent. The cationic polymerization initiator and the anionic polymerization initiator are each a compound that initiates and/or promotes a curing reaction of a curable composition by heating or light irradiation.

The cationic polymerization initiator may be any cationic polymerization initiator that generates cationic species such as Brønsted acids and Lewis acids by heating or light irradiation. Examples of the cationic polymerization initiator include an onium salt, a protonic acid ester, and a complex of a Lewis acid and an amine. These cationic polymerization initiators may be used alone or in combination of two or more thereof.

The anionic polymerization initiator may be any anionic polymerization initiator that generates anion species such as Brønsted bases and Lewis bases by heating or light irradiation. Examples of the anionic polymerization initiator include imidazole and a tertiary amine. These anionic polymerization initiators may be used alone or in combination of two or more thereof.

The fluorine-containing epoxy resin for an electronic component of the disclosure can be dissolved in a solvent and thereby used as a coating material for an electronic component, such as varnish. In other words, the curable composition of the disclosure preferably further contains a solvent. The curable composition of the disclosure is also preferably a coating material for an electronic component.

Examples of the solvent include toluene, xylene, acetone, methyl ethyl ketone, methyl isobutyl ketone, ethyl acetate, dimethyl formamide, and N-methylpyrrolidone. These may be used alone or in combination of two or more thereof.

The amount of the solvent in the curable composition of the disclosure is usually 20 to 95% by mass.

In addition to the fluorine-containing epoxy resin for an electronic component of the disclosure, the curing agent, and the solvent, the curable composition of the disclosure may further contain components including a typical fluorine-free epoxy resin such as a bisphenol A epoxy resin, a brominated bisphenol A epoxy resin, or a novolac epoxy resin, and an epoxy curing agent.

Examples of the fluorine-free epoxy resin include, although some of the following have been already exemplified above, a hydrogenated epoxy resin, an alicyclic epoxy resin, an epoxy resin containing an isocyanurate ring, a bisphenol A epoxy resin, a bisphenol F epoxy resin, a phenol novolac epoxy resin, a cresol novolac epoxy resin, a naphthalene epoxy resin, a biphenyl epoxy resin, a phenol aralkyl epoxy resin, a biphenyl aralkyl epoxy resin, a hydrogenated epoxy resin obtained by hydrogenating the aromatic rings of any of these epoxy resins, and a dicyclopentadiene epoxy resin.

The amount of the fluorine-free epoxy resin is preferably 90 parts by mass or less, more preferably 80 parts by mass or less, still more preferably 50 parts by mass or less, further more preferably 30 parts by mass or less, particularly preferably 10 parts by mass or less relative to 100 parts by mass of the fluorine-containing epoxy resin of the disclosure.

The disclosure also provides a coating film obtainable by applying the curable composition of the disclosure to a substrate. The curable composition may be applied by any method, and examples thereof include spray coating, roll coating, doctor blade coating, dip (immersion) coating, impregnation coating, spin-flow coating, and curtain flow coating, with immersion coating and impregnation coating being preferred.

After application of the curable composition of the disclosure, the coating film may be dried or baked. The drying is preferably performed at 70° C. to 300° C. for 5 to 60 minutes. The baking is preferably performed at 260° C. to 410° C. for 10 to 30 minutes.

The coating film may have any thickness appropriately set according to the intended use, and may have a thickness of 1 to 1000 μm, for example.

The substrate may be any substrate appropriately selected according to the intended use, and examples thereof include substrates made of aluminum, stainless steel, copper, iron, polyimide, polyester, and polyamide.

For example, the curable composition of the disclosure is applied to a sheet substrate by impregnation, and the workpiece is dried at room temperature to 160° C., whereby a prepreg without adhesion can be obtained. The temperature for drying is decided according to the solvent and curing agent used.

Next, a necessary number of the obtained prepregs are stacked and are then subjected to a heat curing reaction at 100° C. to 250° C. and a pressure of 1 to 100 kgf/cm², whereby a laminate can be obtained. The number of layers stacked is not limited and is typically 2 to 50 layers when the laminate is used for a printed wiring board, for example. The disclosure also provides a printed wiring board including a prepreg obtained by impregnation coating a sheet substrate with the curable composition of the disclosure.

The sheet substrate may be almost any sheet substrate typically used for a stacking material. The sheet substrate usually has a thickness of 0.03 to 10 mm, preferably 0.03 to 1 mm, although not being limited thereto. Examples of the sheet substrate include knitted or woven fabrics and non-woven fabrics of inorganic fibers such as glass fibers and carbon fibers and organic fibers such as Kevlar fibers (aromatic polyamide available from Du Pont), and sheets of polytetrafluoroethylene porous material. Preferred examples of the sheet substrate include glass cloths made of glass fibers such as E-glass, C-glass, A-glass, S-glass, D-glass, and YM-31-A glass each containing $SiO_2$ and $Al_2O_3$ as components, and Q-glass containing quartz.

The disclosure relates to a fluorine-containing epoxy resin for an electronic component, represented by the following formula (E):

[Chem. 8]

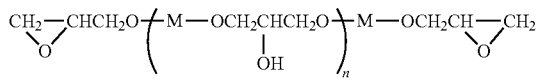

wherein n is an integer of 0 or greater; an average value of n is 0.18 or smaller; and M is a group represented by the following formula (E1):

[Chem. 9]

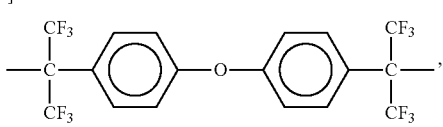

a group represented by the following formula (E2):

[Chem. 10]

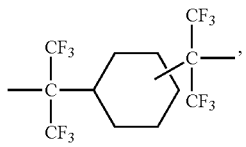

or a group represented by the following formula (E3):

[Chem. 11]

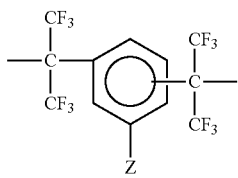

wherein Z is hydrogen or a C2-C10 fluoroalkyl group.

Preferably, the average value of n is 0.09 to 0.18.

Preferably, the M is a group represented by the following formula (E2):

[Chem. 12]

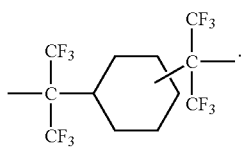

Preferably, the fluorine-containing epoxy resin has a ratio by mole of a 1,3-isomer of the group represented by the formula (E2) to a 1,4-isomer thereof (1,3-isomer/1,4-isomer) of 0/100 to 100/0.

The fluorine-containing epoxy resin for an electronic component of the disclosure may further contain a compound represented by the following formula (F):

[Chem. 13]

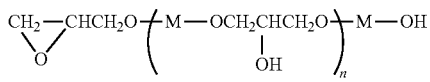

wherein M and n are defined as described above, in an amount of 0 to 10% by mass.

The fluorine-containing epoxy resin for an electronic component of the disclosure may further contain a fluorine-containing diol represented by the following formula (G):

HO-M-OH wherein M is defined as described above, in an amount of 0 to 10% by mass.

The disclosure also provides a method for producing a fluorine-containing epoxy resin including:

reacting a fluorine-containing diol represented by the following formula (G):

HO-M-OH wherein M is a group represented by the following formula (E1):

[Chem. 14]

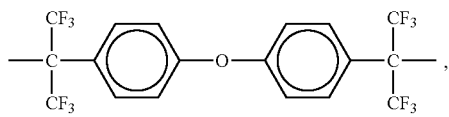

a group represented by the following formula (E2):

[Chem. 15]

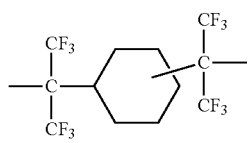

or a group represented by the following formula (E3):

[Chem. 16]

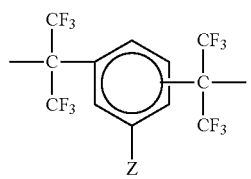

wherein Z is hydrogen or a C2-C10 fluoroalkyl group, with a compound containing a double bond to provide a fluorine-containing olefin containing two double bonds; and oxidizing the fluorine-containing olefin to provide a fluorine-containing epoxy resin.

The disclosure also provides a curable composition containing: the fluorine-containing epoxy resin for an electronic component or a fluorine-containing epoxy resin obtained by the production method; and a curing agent.

EXAMPLES

The disclosure is described with reference to examples, but the examples are not intended to limit the disclosure.

The parameters in the examples were determined as follows.

Determination by GPC

Determination by GPC was performed using Shodex KF-801 and KF-802 each having a length of 30 cm as columns and chloroform as a developing solvent.

Water Absorption Rate of Fluorine-Containing Epoxy Resin

A 0.1-mm-thick film was prepared and immersed in water at 23° C. The mass of the film after 24 hours was defined as W24, and the mass of the film after drying at 100° C. for 24 hours was determined as W0. The water absorption rate was calculated according to the following formula.

Water absorption rate=$(W24-W0)/W0*100\%$

Moisture Absorption Rate of Fluorine-Containing Epoxy Resin

A 0.1-mm-thick film was prepared. The mass of the film after being left to stand in a constant temperature and humidity test chamber (available from Espec Corporation, SH-221) at a temperature of 80° C. and a humidity of 80% for 24 hours was defined as Z24, and the mass of the film after drying at 100° C. for 24 hours was determined as Z0. The water absorption rate was calculated according to the following formula.

Moisture absorption rate=(Z24−Z0)/Z0*100%

Glass Transition Temperature of Fluorine-Containing Epoxy Resin

The glass transition temperature was determined as the temperature Tg (° C.) at the middle point of an endothermic curve of second run, the endothermic curve being obtained by performing temperature rising (first run)—temperature dropping—temperature rising (second run) at a temperature-changing rate of 10° C./min in a temperature range from 30° C. to 250° C. using a differential scanning calorimeter (DSC, available from SEIKO, RTG220).

Permittivity and Dissipation Factor of Fluorine-Containing Epoxy Resin

The permittivity and dissipation factor were determined by analyzing the values obtained by a measurement with a cavity resonator (available from KANTO Electronic Application and Development Inc.) at 11 GHz, using a network analyzer (available from Agilent Technologies Japan, Ltd., model 8719ET).

Coefficient of Thermal Linear Expansion of Fluorine-Containing Epoxy Resin

Using a thermal mechanical analyzer SS-6100 (available from Seiko Instruments Inc.), the elongation of the film was measured at tensile mode, a temperature range of 25° C. to 150° C., a temperature-increasing rate of 2° C./min, an initial load of 10 mN, and a distance between chucks of 10 mm. From the obtained measurement results, the average coefficient of thermal linear expansion was calculated according to the following formula. In the formula, L(30) indicates the length of the sample at 30° C., and L(100) indicates the length of the sample at 100° C.

Average coefficient of thermal linear expansion=(1/L(30))[(L(100)−L(30))/(100−30)]

Example 1

A compound represented by the following formula A in an amount of 86 g (0.21 mol) and epichlorohydrin in an amount of 382 g (4.13 mol) were mixed. To the mixture was added 16.8 g (0.42 mol) of sodium hydroxide and 2 mL of water, and the mixture was heated to reflux while being stirred. After the reaction for 10 hours, the resulting product was filtered with a glass filter to remove generated sodium chloride, and excessive epichlorohydrin was removed under reduced pressure. GPC analysis of the refined product revealed that the product was a fluorine-containing epoxy resin B1 in which the ratio (area ratio) of compounds having an m value in the following formula B of 0, 1, and 2 was 93:6:1 and the average value of n was 0.08. The epoxy equivalent was 290.

[Chem. 17]

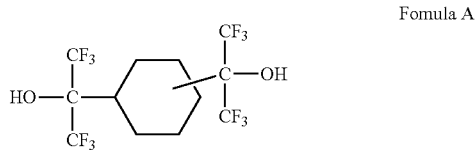

Formula A

[Chem. 18]

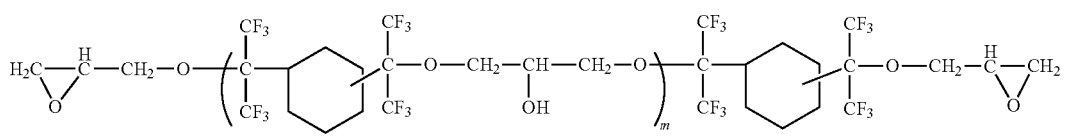

Formula B

Example 2

The fluorine-containing epoxy compound having an n value of 0.08 obtained in Example 1 was distilled under reduced pressure (138° C. to 150° C./1 mmHg), whereby a fluorine-containing epoxy resin B2 was obtained as an initial fraction, in which the ratio (area ratio) of compounds having an m value in the formula B of 0, 1, and 2 was 99:1:0 and the average value of n was 0.01. The epoxy equivalent was 271.

Comparative Example 1

A compound represented by the formula A in an amount of 430 g (1 mol) and a 10% sodium hydroxide aqueous solution in an amount of 750 g (1.88 mol as NaOH) were heated under stirring to be dissolved. The resulting solution heated to 58° C. was rapidly mixed with 145 g (1.57 mol) of epichlorohydrin. The mixture was reacted for about 40 minutes at 58° C. to 63° C. and then refluxed for 10 hours. Refinement was performed as in Example 1. GPC analysis of the refined product revealed that the product was a fluorine-containing epoxy resin B3 in which the ratio (area ratio) of compounds having an m value in the formula B of 0, 1, 2, and 3 was 29:32:23:16 and the average value of n was 1.27. The epoxy equivalent was 609.

Comparative Example 2

A compound represented by the formula A in an amount of 430 g (1 mol) and a 10% sodium hydroxide aqueous solution in an amount of 750 g (1.88 mol as NaOH) were heated under stirring to be dissolved. To the resulting solution heated to 58° C. was gradually added 203 g (2.2 mol) of epichlorohydrin. The mixture was reacted for about one hour at 58° C. to 63° C. and then refluxed for 10 hours. Refinement was performed as in Example 1. GPC analysis of the refined product revealed that the product was a fluorine-containing epoxy resin B4 in which the ratio (area ratio) of compounds having an m value in the formula B of 0, 1, and 2 was 80:15:5 and the average value of n was 0.25. The epoxy equivalent was 331.

Example 3

A sodium hydroxide aqueous solution (50 wt %) in an amount of 384 g (4.8 mol) was added to 328 g (0.8 mol) of bis(1,1,1,3,3,3-hexafluoro-2-hydroxyisopropyl)cyclohexane. The reactor system was purged with nitrogen and heated to 40° C. Then, 3.2 g (0.01 mol) of tetrabutylammonium bromide was added to the system, and then 154 g (2 mol) of allyl chloride was gradually added dropwise thereto to cause a reaction. After the reaction, 70 g of toluene was added to cause liquid separation, and the resulting product was washed with water until the organic phase was neutralized. After the liquid separation, components in the organic phase such as the solvent were removed with an evaporator. The resulting product was precisely distilled to provide a fluorine-containing allyl ether (structural formula C).

[Chem. 19]

Formula C

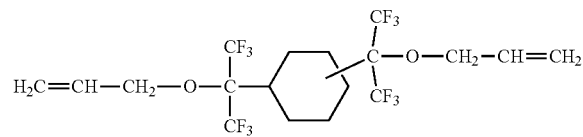

Subsequently, a fluorine-containing epoxy resin was synthesized by oxidization with hydrogen peroxide.

The fluorine-containing allyl ether represented by the structural formula C in an amount of 97 g (0.2 mol), benzonitrile in an amount of 300 g, and triethylamine in an amount of 10 g (0.1 mol) were mixed. To the reaction solution being stirred and adjusted to 80° C., 42 g (0.6 mol) of a 35% hydrogen peroxide aqueous solution was gradually added dropwise. After the dropwise addition, the reaction solution was cooled to room temperature and stirred for one day. The reaction product was distilled and refined to provide a glycidyl ether represented by the formula D in an amount of about 12 g. The average value of n was 0. This glycidyl ether was defined as a fluorine-containing epoxy resin D1. The epoxy equivalent was 270.

[Chem. 20]

Formula D

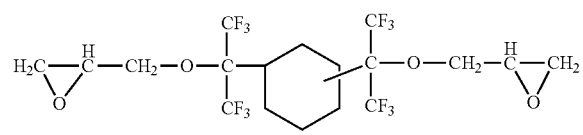

Example 4

The fluorine-containing epoxy resin B1 obtained in Example 1 was mixed with 2-ethyl-4-methyl imidazole as a catalyst in an amount of 2 parts relative to 100 parts of the epoxy resin. The contents were heated to 50° C. and uniformly mixed to provide a curable composition. The curable composition was cured at 200° C. for five hours to provide a specimen. The permittivity, dissipation factor, and coefficient of linear expansion of the specimen were determined. The results are shown in Table 1.

Examples 5 and 6

Curable compositions were produced as in Example 4, except that the fluorine-containing epoxy resin was changed to the fluorine-containing epoxy resin B2 obtained in Example 2 or the fluorine-containing epoxy resin D1 obtained in Example 3. The physical properties of cured products were determined. The results are shown in Table 1.

Comparative Examples 3 and 4

Curable compositions were produced as in Example 4, except that the fluorine-containing epoxy resin was changed to the fluorine-containing epoxy resin B3 obtained in Comparative Example 1 or the fluorine-containing epoxy resin B4 obtained in Comparative Example 2. The physical properties of cured products were determined. The results are shown in Table 1.

TABLE 1

| | | Example 4 | Example 5 | Example 6 | Comparative Example 3 | Comparative Example 4 |
|---|---|---|---|---|---|---|
| | Fluorine-containing epoxy resin | Example 1 B1 | Example 2 B2 | Example 3 D1 | Comparative Example 1 B3 | Comparative Example 2 B4 |
| | n | 0.08 | 0.01 | 0 | 1.27 | 0.25 |
| Composition of curable composition | Fluorine-containing epoxy resin (parts by mass) | 100 | 100 | 100 | 100 | 100 |
| | 2-Ethyl-4-methyl imidazole (parts by mass) | 2 | 2 | 2 | 2 | 2 |
| Physical properties of curable composition | Water absorption rate (%) 23° C., 24 hours | 0.6 | 0.8 | 0.7 | 1.5 | 0.9 |
| | Humidity absorption rate (%) 85° C. 85%, 24 hours | 1.2 | 1.1 | 1 | 2.3 | 1.5 |
| | Glass transition temperature (° C.) | 135 | 141 | 139 | 108 | 125 |

TABLE 1-continued

|  | Example 4 | Example 5 | Example 6 | Comparative Example 3 | Comparative Example 4 |
|---|---|---|---|---|---|
| Permittivity (11 GHz) | 2.51 | 2.53 | 2.52 | 3.01 | 2.78 |
| Dielectric dissipation factor (11 GHz) | 0.0159 | 0.0152 | 0.0155 | 0.025 | 0.022 |
| Coefficient of linear expansion (ppm) | 55 | 49 | 51 | 75 | 65 |

In methyl ethyl ketone were dissolved 2 g of the fluorine-containing epoxy resin B1 obtained in Example 1 as the fluorine-containing epoxy resin, 8 g of a commercially available phenol cresol novolac epoxy resin (available from DIC Corporation, EPICLON N-673-80M, epoxy equivalent 208 g/eq), an equivalent of a commercially available phenol novolac resin (available from DIC Corporation, PHENO-LITE TD-2093-60M, hydroxy group equivalent 104 g/eq) as the curing agent, and 0.2 g of ethyl 4-methyl imidazole as a curing accelerator, to provide a curable composition having a solid concentration of 50%.

This varnish was applied to a CF-T9 electrolytic copper foil (thickness 12 μm) available from Fukuda Metal Foil & Powder Co., Ltd. The coating film was dried at 40° C. for 10 minutes and was further dried at 120° C. for 10 minutes. Another cycle of application and drying was repeated, whereby copper foil coated with a 50 μm-thick resin was suitably obtained. Four sheets of the copper foil coated with the resin were pressure molded at 170° C. and 3 MPa to provide a laminate. This laminate was useful as a low-dielectric build-up material.

What is claimed is:

1. A high frequency printed circuit board comprising a substrate coated with a film of a curable composition comprising:
    a fluorine-containing epoxy resin represented by the following formula (E):

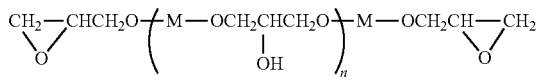

wherein n is an integer of 0 or greater; an average value of n is 0.10 or smaller; and M is a group represented by the following formula (E2):

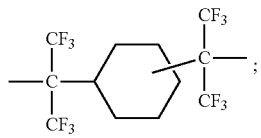

and
    a curing agent, wherein the curing agent is at least one selected from the group consisting of polyamines, polycarboxylic acids, acid anhydrides, phenols, imidazoles, polymercaptans, and organic acid hydrazides,
    wherein the amount of the curing agent is 0.1 to 50 parts by mass relative to 100 parts by mass of the fluorine-containing epoxy resin.

2. The high frequency printed circuit board according to claim 1,
    wherein the average value of n is 0.09 to 0.10.

3. The high frequency printed circuit board according to claim 1,
    wherein the fluorine-containing epoxy resin has a ratio by mole of a 1,3-isomer of the group represented by the formula (E2) to a 1,4-isomer thereof (1,3-isomer/1,4-isomer) of 0/100 to 100/0.

4. The high frequency printed circuit board according to claim 1, which optionally further comprises a compound represented by the following formula (F):

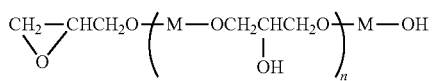

wherein M and n are defined as described above, in an amount of up to 10% by mass.

5. The high frequency printed circuit board according to claim 1, which optionally further comprises a fluorine-containing diol represented by the following formula (G):

HO-M-OH wherein M is defined as described above, in an amount of up to 10% by mass.

6. A method for producing the high frequency printed circuit board according to claim 1 comprising:
    reacting a fluorine-containing diol represented by the following formula (G):

HO-M-OH wherein M is a group represented by the following formula (E2):

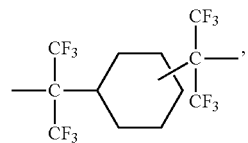

with a compound containing a double bond to provide a fluorine-containing olefin containing two double bonds;
    oxidizing the fluorine-containing olefin to provide the fluorine-containing epoxy resin,
    mixing the fluorine-containing epoxy resin and the curing agent to prepare the curable composition, and
    applying the curable composition to the substrate to provide the coating film.

* * * * *